US008000954B2

(12) United States Patent
Schalick

(10) Patent No.: US 8,000,954 B2
(45) Date of Patent: Aug. 16, 2011

(54) FPGA EMULATION SYSTEM

(75) Inventor: Christopher A. Schalick, Bedford, MA (US)

(73) Assignee: Gaterocket, Inc., Bedford, MA (US)

( * ) Notice: Subject to any disclaimer, the term of this patent is extended or adjusted under 35 U.S.C. 154(b) by 356 days.

(21) Appl. No.: 11/375,521

(22) Filed: Mar. 14, 2006

(65) Prior Publication Data
US 2006/0253762 A1 Nov. 9, 2006

Related U.S. Application Data

(60) Provisional application No. 60/662,427, filed on Mar. 16, 2005.

(51) Int. Cl.
G06F 9/455 (2006.01)

(52) U.S. Cl. ........................................................ 703/23
(58) Field of Classification Search .................... 703/20, 703/21, 22, 24, 23
See application file for complete search history.

(56) References Cited

U.S. PATENT DOCUMENTS

| | | |
|---|---|---|
| 4,342,093 A | 7/1982 | Miyoshi |
| 4,590,581 A | 5/1986 | Widdoes, Jr. |
| 4,744,084 A | 5/1988 | Beck et al. |
| 4,769,817 A | 9/1988 | Krohn et al. |
| 5,036,473 A | 7/1991 | Butts et al. |
| 5,109,353 A | 4/1992 | Sample |
| 5,126,966 A | 6/1992 | Hafeman et al. |
| 5,146,460 A | 9/1992 | Ackerman et al. |
| 5,479,355 A | 12/1995 | Hyduke |
| 5,596,742 A | 1/1997 | Agarwal et al. |
| 5,625,301 A | 4/1997 | Plants et al. |
| 5,682,107 A | 10/1997 | Tavana et al. |
| 5,809,283 A | 9/1998 | Vaidyanathan et al. |
| 5,812,414 A | 9/1998 | Butts et al. |

(Continued)

OTHER PUBLICATIONS

Andrew S. Tanenbaum; Structured Computer Organization, 2nd ed.; 1984; ISBN 0138544239; pp. 10-12.*
"Identify Pro", http://www.synplicity.com/products/identify/index.html Synplicity, Inc., Sunnyvale, CA, Oct. 23, 2008, pp. 1-2.

(Continued)

*Primary Examiner* — Paul Rodriguez
*Assistant Examiner* — Juan Ochoa
(74) *Attorney, Agent, or Firm* — Iandiorio Teska & Coleman

(57) ABSTRACT

This invention features an FPGA emulation system including an FPGA device under test having a plurality of pins. A bus functional model circuit responsive to signals representing predetermined input characteristics of the FPGA device under test and configured to apply one or more signals to the FPGA device under test corresponding to the predetermined input characteristics and configured to receive one or more signals representing output characteristics of the FPGA device under test to emulate the operation of the FPGA device under test in a predefined selectable and flexible electrical operating environment. This invention also features an FPGA emulation system including an FPGA device under test having at least one component and a plurality of pins operating in a predetermined native target environment, a bus functional model engine for simulating and capturing output characteristics of the at least one component of the FPGA device under test and simulating and releasing input characteristics of the at least one component of the FPGA device under test, and a bus functional model circuit embedded in the FPGA device under test configured to receive one or more signals representing the input characteristics of the at least one component and configured to release one or more signals representing the output characteristics of the at least one component such that the bus functional model engine emulates the operation of the at least one component of the FPGA device under test in the predetermined native target environment.

56 Claims, 8 Drawing Sheets

U.S. PATENT DOCUMENTS

| | | |
|---|---|---|
| 5,958,026 A | 9/1999 | Goetting et al. |
| 6,020,760 A | 2/2000 | Sample et al. |
| 6,123,735 A * | 9/2000 | Raghavan et al. ............... 703/21 |
| 6,286,114 B1 | 9/2001 | Veenstra et al. |
| 6,388,465 B1 | 5/2002 | Barbier et al. |
| 6,389,558 B1 | 5/2002 | Herrmann et al. |
| 6,571,204 B1 * | 5/2003 | Meyer ............................. 703/22 |
| 6,594,802 B1 | 7/2003 | Ricchetti et al. |
| 6,618,686 B2 | 9/2003 | Allamsetty |
| 6,650,140 B2 | 11/2003 | Lee et al. |
| 6,654,919 B1 * | 11/2003 | Watkins ........................ 714/733 |
| 6,665,855 B2 | 12/2003 | Payne et al. |
| 6,668,364 B2 | 12/2003 | McElvain et al. |
| 6,678,625 B1 * | 1/2004 | Reise et al. ................... 702/117 |
| 6,678,645 B1 * | 1/2004 | Rajsuman et al. ............... 703/20 |
| 6,681,353 B1 | 1/2004 | Barrow |
| 6,691,266 B1 | 2/2004 | Winegarden et al. |
| 6,754,862 B1 | 6/2004 | Hoyer et al. |
| 6,760,898 B1 | 7/2004 | Sanchez et al. |
| 6,874,107 B2 | 3/2005 | Lesea |
| 7,548,841 B2 * | 6/2009 | Terashima et al. ............... 703/13 |
| 2003/0105617 A1 * | 6/2003 | Cadambi et al. ................ 703/14 |

OTHER PUBLICATIONS

"ESNUG" (DAC 03, Item 21), Subject: Synplicity Synplify & Identify & Certify, http://www.deepchip.com/items/dac03-21.html, Oct. 23, 2008, pp. 1-8.

"SignalTap II Embedded Logic Analyzer", Altera Corporation, San Jose, CA, http://www.altera.com//common/print/prt-print.jsp?page=products/2 pages, Jan. 6, 2006, 3 pages.

"Implementing DSP Algorithms in FPGAs", A detailed overview of Xilinx System Generator for DSP, using a QAM system design example, Xilinx, Inc., San Jose, CA, Oct. 23, 2008, 3 pages.

"Enhanced FPGA Prototyping", Simpod, Inc., Data Sheet, Santa Clara, CA, 2003, 2 pages.

"SimuTAG links FPGA chips to HDL Simulators", Product Description, SynaptiCAD, Inc., Blacksburg, VA, Oct. 23, 2008, 3 pages.

Haufe, et al., "Accelerated Logic Simulation by Using Prototype Boards", Design, Automation and Test in Europe, 1998, Paris, 23.-26.2.98, 183-189.

"ChipScope Pro at a Glance", ChipScope Pro, Xilinx, Inc., Data Sheet, San Jose, CA, 2005, 3 pages.

* cited by examiner

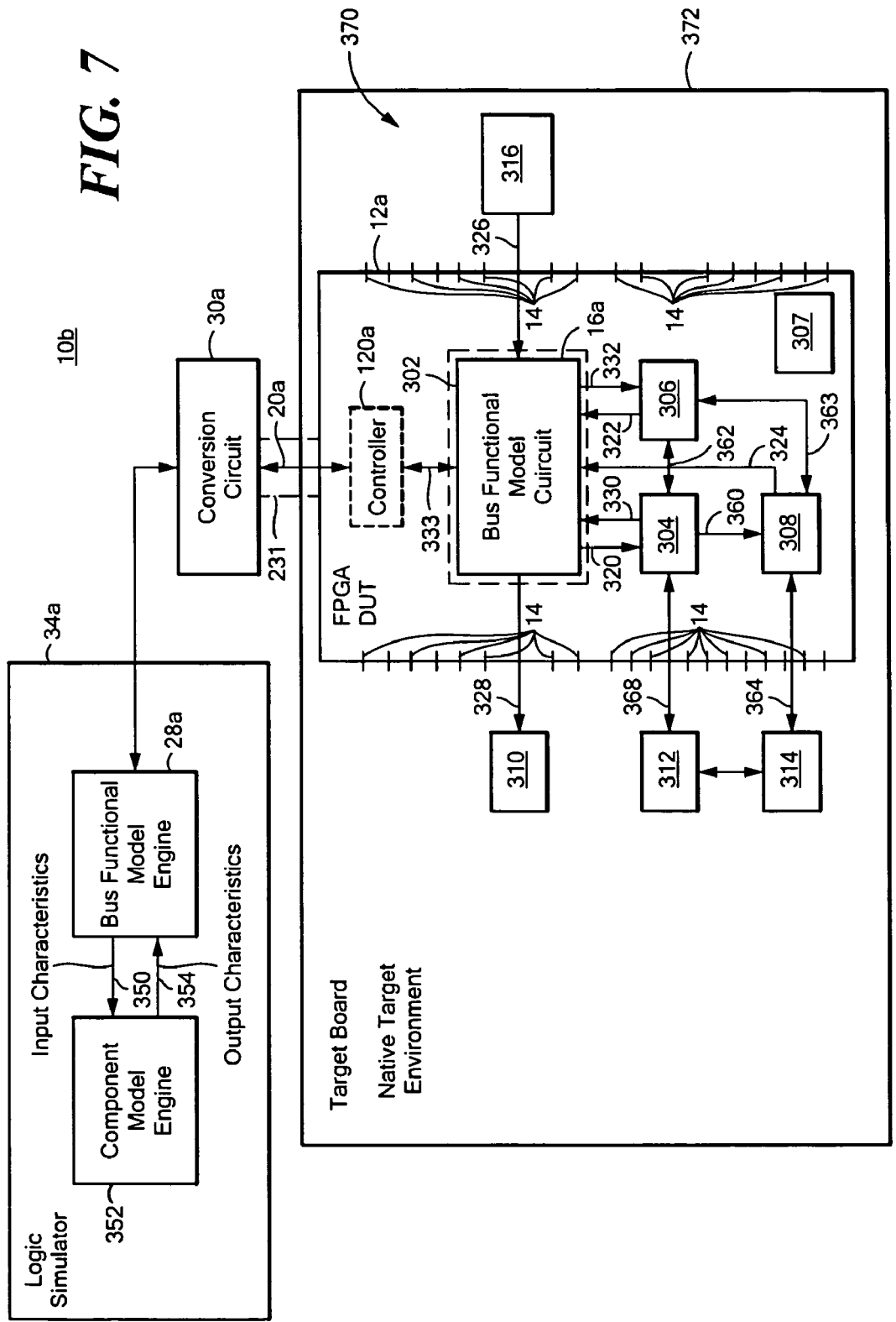

FPGA EMULATION SYSTEM

RELATED APPLICATIONS

This application claims benefit of U.S. Provisional Application Ser. No. 60/662,427, filed on Mar. 16, 2005, entitled "Scalable FPGA Emulation System", hereby incorporated herein by reference.

FIELD OF THE INVENTION

This invention relates to an improved field programmable gate array (FPGA) emulation system that emulates the operation of an FPGA design in a selectable and flexible electrical operating environment.

BACKGROUND OF THE INVENTION

An FPGA is often used to prototype logic designs for custom silicon devices such as ASICs, and the like. Because an FPGA is less expensive and typically takes less time to develop than an ASIC or similar device, the logic design intended for an ASIC is often ported to an FPGA for evaluation prior to committing it to production. An FPGA may also be included in the design of a final product that does not need the high performance, low cost or design capacity of an ASIC. In this case, the expense associated with developing a custom silicon device is not justified when compared to the cost of using an FPGA with customized logic.

Conventional systems and methods used to develop, emulate and verify an FPGA design, include, inter alia, logic simulators, logic emulators, custom prototype boards, and evaluation boards.

Logic simulators are software programs that analyze and test hardware designs as expressed in Hardware Description Languages (HDLs). Logic simulators provide a means to test interfaces and test sequences to model the expected operation of the design of an FPGA or similar device in its target electrical operating environment. However, logic simulators are slow when compared to the speed of an FPGA. Logic simulators only model the behavior of digital events and are typically not used to model analog behavior of the various components of an FPGA. Logic simulators also cannot model the constraints imposed by the physical structure of a typical FPGA, such as package pin functions, and the like. Logic simulators also provide no information about physical constraints of the FPGA such as its power supply current limitation, pinout restrictions, device logic capacity, and the like.

Logic emulators are used to boost the performance of logic simulators. Logic emulators typically employ special purpose hardware to accelerate simulation speed. The logic emulator is intended to speed up the same types of events that logic simulators model, namely, digital events. Hence, logic emulators provide no new information over logic simulators and cannot determine whether a logic design will fit within a specific FPGA or if the FPGA will operate at the desired speed of the target system.

Custom hardware prototype boards are often used to verify the design of an FPGA before committing it to production. A typical prototype board may include all, or a subset of, the components intended to interact with an FPGA. By definition, prototype boards are considered flawed. The very purpose of building a prototype board is to discover design flaws in hardware and system design of the FPGA. Errors involving the pinout configuration of the FPGA typically cannot be repaired without re-building the entire prototype board. Errors related to the power supplies of the FPGA may result in a non-functional board. Errors in configuration and programming interfaces often result in an FPGA that cannot be programmed on the prototype board. Prototype boards are also very expensive and time consuming to build.

Another approach to prototyping and evaluating an FPGA design employs evaluation boards. Evaluation boards are developed for the purpose of providing a known good hardware implementation of an FPGA on a premanufactured board. The evaluation board typically has all the required support circuits and connections to use an FPGA with the desired design to be prototyped. Evaluation boards may incorporate other electronic components, e.g., memories, communications ports, oscillators, and the like, that are commonly connected to the FPGA in a complex system.

One problem with evaluation boards is that the FPGA design typically has to be modified or tailored to fit on an existing evaluation board. Evaluation boards often have an FPGA device that is close, but not exactly the same as, the desired FPGA device. In other cases, the evaluation board may have the desired FPGA device but it is not mounted in the desired device package. The result is the evaluation board may not provide information about the validity of pinout configurations of the target FPGA design. Because the FPGA on an evaluation board is connected with specific pins connected to specific components, the desired FPGA design must be changed to fit within the connections of the pre-existing evaluation board. This requires the pinout of the target FPGA design to be changed to match the connections on the evaluation board. When the FPGA on the evaluation board is not the same as the desired target FPGA device, the programming image of the FPGA design must be modified to match the evaluation board. The logic in the desired FPGA design may also have to be modified to fit within the available FPGA device and communicate with the connected devices on the evaluation board. Any changes to the target FPGA design have the potential to prevent detection of errors in the design, or may introduce new errors, in the target FPGA design, rendering the modeling effort useless.

Conventional emulation systems and logic simulators also provide no way to emulate and verify the internal operation of the various components within an FPGA in the actual target environment of the FPGA using software. Conventional emulation systems and logic simulators are typically intended to operate decoupled from the target operating environment of the actual FPGA design. Thus, the operation of design components inside the FPGA can only be tested apart from the external components they are intended to communicate with. Conventional emulation systems have some capability to replace the FPGA component in its native operating environment. However, electrical communication with an emulator prohibits high speed communication between the emulated FPGA design and the native environment. Testing of actual FPGA circuits at the speed they are intended to operate in their native operating environment typically cannot be achieved with conventional emulation systems and logic simulators.

Conventional logic simulators and emulation systems often provide inaccurate system models, inaccurate FPGA circuit models, and inaccurate design translation software. Once an FPGA is programmed and operating in its native operating environment, the FPGA interacts with real devices which behave differently than their corresponding models in simulation or emulation. The reactions of components inside the programmed FPGA differ accordingly. Moreover, the circuit elements programmed in the FPGA are translated from their HDL descriptions to circuit elements. In practice, this translation process is imperfect, resulting in differences between design function in simulation or emulation and in the native operating environment of the FPGA device. Furthermore, simulation models of analog and special purpose circuit elements of an FPGA are used to verify operation of custom defined circuits. In practice, these models and the circuits they model are imperfect and functional differences result between logic simulation or emulation and actual FPGA designs.

Conventional logic simulators and emulation systems are often used to model and test the design behavior of various components inside the FPGA, such as memories, microprocessors, SERDES, and the like. In practice, these models are not as accurate as the elements they model in the actual FPGA components. The technology mapping from the original FPGA design description to FPGA components differs from the models used in both logic simulators and conventional emulation systems. This mapping difference results in functional differences between the simulated or emulated designs and the actual FPGA designs.

BRIEF SUMMARY OF THE INVENTION

It is therefore an object of this invention to provide an improved FPGA emulation system.

It is a further object of this invention to provide such an FPGA emulation system which emulates the operation of an FPGA design in a selectable and flexible electrical operating environment of the FPGA design.

It is a further object of this invention to provide such an FPGA emulation system which emulates the operation of an FPGA design at the speed the FPGA is intended to operate.

It is a further object of this invention to provide such an FPGA emulation system which enables testing of FPGA designs in their native operating environment prior to completing the design of the components of the FPGA.

It is a further object of this invention to provide such an FPGA emulation system which emulates the operation of both digital and analog processes of an FPGA design in a selectable and flexible electrical operating environment.

It is a further object of this invention to provide such an FPGA emulation system which accurately emulates and verifies an FPGA design without the need to build a custom prototype board or rely on evaluation boards.

It is a further object of this invention to provide such an FPGA emulation system which eliminates the need to rebuild a custom prototype board when the design of an FPGA changes.

It is a further object of this invention to provide such an FPGA emulation system which reduces the time required to emulate and verify an FPGA design.

It is a further object of this invention to provide such an FPGA emulation system which decreases development time of an FPGA design.

It is a further object of this invention to provide such an FPGA emulation system which is more accurate than conventional simulations of an FPGA design.

It is a further object of this invention to provide such an FPGA emulation system which can measure quality and accuracy of simulation models and/or technology translation processes.

It is a further object of this invention to provide such an FPGA emulation system which provides for rapid prototyping of an FPGA design.

It is a further object of this invention to provide such an FPGA emulation system which is less complex.

It is a further object of this invention to provide such an FPGA emulation system which is less expensive.

It is a further object of this invention to provide such an FPGA emulation system which may include a logic simulator that operates and monitors portions of an FPGA design from inside the FPGA design in the actual target electrical operating environment of the FPGA.

It is a further object of this invention to provide such an FPGA emulation system which can control and/or emulate the operation of at least one component of an FPGA design using software.

The invention results from the realization that an improved FPGA emulation system that can emulate both digital and analog processes of an FPGA design being tested at the desired speed of the FPGA device and in a selectable and flexible electrical operating environment to provide for rapid prototyping of the FPGA design while easily accommodating for design changes without rebuilding a prototype board or relying on inaccurate evaluation boards or simulation models which do not exactly match a desired FPGA design is effected, in one embodiment, with a bus functional model engine that simulates and captures predetermined input characteristics of an FPGA design being tested and simulates and releases output characteristics of the FPGA design, and a bus functional model circuit responsive to signals representing the input characteristics that applies signals to the FPGA device being tested that correspond to the predetermined input characteristics. The FPGA device being tested processes and responds to the input characteristics and sends signals to the bus functional model circuit that represent the output characteristics of the FPGA device being tested. The bus functional model circuit captures the output characteristics that are released by the bus functional model engine to emulate the operation of the FPGA device under test in a selectable and flexible electrical operating environment that is defined by the system. The bus functional model circuit may be placed outside the FPGA to enable testing of the FPGA design from the outside. In another embodiment, the bus functional model circuit may be placed inside the FPGA to enable testing of the at least one, a plurality, or all, of the components of the FPGA device being tested in a predetermined native target environment.

The subject invention, however, in other embodiments, need not achieve all these objectives and the claims hereof should not be limited to structures or methods capable of achieving these objectives.

This invention features an FPGA emulation system including an FPGA device under test having a plurality of pins and a bus functional model circuit responsive to signals representing predetermined input characteristics of the FPGA device under test and configured to apply one or more signals to the FPGA device under test corresponding to the predetermined input characteristics and configured to receive one or more signals representing output characteristics of the FPGA device under test to emulate the operation of the FPGA device under test in a predefined selectable and flexible electrical operating environment.

In a preferred embodiment, the system may further include a bus functional model engine for simulating and capturing the predetermined input characteristics and simulating and releasing the output characteristics. The bus functional model engine may emulate the operation of the FPGA device under test in the predefined selectable and flexible electrical operating environment. The bus functional model circuit may be configured to apply at least one test operation to the FPGA device under test and may emulate the results of the at least one test operation in the predefined selectable and flexible electrical operating environment. The bus functional model circuit may include a plurality of pins. The bus functional model circuit may be coupled to the FPGA device under test. Each pin of selected pins of the FPGA device under test may be coupled to a corresponding pin type of the bus functional model circuit. The system may further include protective circuitry coupled between the FPGA device under test and the bus functional model circuit. The bus functional model circuit and the FPGA device under test may be chosen to have similar electrical properties and functions. The one or more signals applied to the FPGA device under test may include one or more signals chosen from the group consisting of: power supply signals, timing reference signals, impedance reference signals, and signals representing the predetermined input characteristics. The system may further include a controller circuit responsive to the predetermined input characteristics and commands that select one or more of at least one programmable power supply, at least one programmable oscillator circuit, at least one programmable impedance reference device, and at least one programmable timing reference device to define the predefined selectable and flexible electrical operating environment. The at least one programmable impedance reference device may provide one or more impedance reference signals to the bus functional model circuit and the FPGA device under test. The at least one programmable timing reference device may provide one or more timing reference signals to the bus functional model circuit and the FPGA device under test. The bus functional model circuit, the FPGA device under test, the controller circuit, the at least one programmable power supply, the at least one programmable oscillator circuit, the at least one programmable impedance reference device, and the at least one programmable timing reference device may be disposed on a removable device. The removable device may be integrated with a computer system. The system may further include a conversion circuit for converting the predetermined input characteristics to electrical control signals and the output characteristics to software signals. The electrical control signals may enable the bus functional model circuit. The electrical control signals may enable one or more of the at least one programmable power supply, the at least one programmable oscillator circuit, the at least one programmable impedance reference device, and a the at least one programmable timing reference device. The system may further include a logic simulator coupled to the bus functional model engine for receiving simulated inputs and transmitting simulated outputs.

This invention also features an FPGA emulation system including a bus functional model circuit responsive to signals representing predetermined input characteristics of an FPGA device under test and configured to apply one or more signals to the FPGA device under test corresponding to the predetermined input characteristics and configured to receive one or more signals representing output characteristics of the FPGA device under test to emulate the operation of the FPGA device under test in a predefined selectable and flexible electrical operating environment.

This invention further features an FPGA emulation system including an FPGA device under test having a plurality of pins, a bus functional model engine for simulating and capturing predetermined input characteristics of the FPGA device under test and simulating and releasing output characteristics of the FPGA device under test, and a bus functional model circuit responsive to signals representing the predetermined input characteristics configured to apply one or more signals to the FPGA device under test corresponding to the predetermined input characteristics and configured to receive one or more signals representing output characteristics of the FPGA device under test such that the bus functional model engine emulates the operation of the FPGA device under test in a predefined selectable and flexible electrical operating environment.

In a preferred embodiment, the bus functional model circuit may be configured to apply at least one test operation to the FPGA device under test and emulate the results of the at least one test operation in the predefined selectable and flexible electrical operating environment. The bus functional model circuit may include a plurality of pins. The bus functional model circuit may be coupled to the FPGA device under test. Each pin, or selected pins, of the FPGA device under test may be coupled to a corresponding pin type of the bus functional model circuit. The system may further include protective circuitry coupled between the FPGA device under test and the bus functional model circuit. The bus functional model circuit and the FPGA device under test may be chosen to have similar electrical properties and functions. The one or more signals applied to the FPGA device under test may include one or more signals chosen from the group consisting of: power supply signals, timing reference signals, impedance reference signals, and signals representing the predetermined input characteristics. The system may further include a controller circuit responsive to the predetermined input characteristics and commands that select one or more of at least one programmable power supply, at least one programmable oscillator circuit, at least one programmable impedance reference device, and at least one programmable timing reference device to define the predefined selectable and flexible electrical operating environment. The at least one programmable impedance reference device may provide one or more impedance reference signals to the bus functional model circuit and the FPGA device under test. The least one programmable timing reference device may provide one or more timing reference signals to the bus functional model circuit and the FPGA device under test. The at least one programmable power supply, the at least one programmable oscillator circuit, the at least one programmable impedance reference device, and the at least one programmable timing reference device may be disposed on a removable device. The removable device may be integrated with a computer system. The system may further include a conversion circuit for converting the predetermined input characteristics to electrical control signals and the output characteristics to software signals. The electrical control signals may enable the bus functional model circuit. The electrical control signals may enable one or more of the at least one programmable power supply, the at least one programmable oscillator circuit, the at least one programmable impedance reference device, and the at least one programmable timing reference device. The system may further include a logic simulator coupled to the bus functional model engine for receiving simulated inputs and transmitting simulated outputs.

This invention also features an FPGA emulation system including a bus functional model engine for simulating and capturing predetermined input characteristics of an FPGA device under test and simulating and releasing output characteristics of the FPGA device under test and a bus functional model circuit responsive to signals representing the predetermined input characteristics configured to apply one or more signals to the FPGA device under test corresponding to the predetermined input characteristics of the FPGA device under test such that the bus functional model engine emulates the operation of the FPGA device under test in a predefined selectable and flexible electrical operating environment.

This invention further features an FPGA emulation system including an FPGA device under test having a plurality of pins, a bus functional model circuit having a plurality pins, a connector coupling the FPGA device under test to the bus functional model circuit, and wherein the bus functional model circuit is programmed to input signals into the FPGA device under test and to receive output signals from the FPGA device under test to more accurately emulate the operation of the FPGA device under test in a predefined selectable and flexible electrical operating environment.

In a preferred embodiment, the bus functional model circuit may be configured to apply at least one test to the FPGA device under test in the predefined selectable and flexible electrical operating environment and emulate the results of the at least one test. Each pin, or selected pins, of the FPGA device under test may be coupled to a corresponding pin type of the bus functional model circuit. The system may further include protective circuitry coupled between the pins of the FPGA device under test and the bus functional model circuit.

This invention also features an FPGA emulation system including an FPGA device under test having at least one component and a plurality of pins operating in a predetermined native target environment, a bus functional model engine for simulating and capturing output characteristics of the at least one component of the FPGA device under test and simulating and releasing input characteristics of the at least one component of the FPGA device under test, and a bus functional model circuit embedded in the FPGA device under test configured to receive one or more signals representing the input characteristics of the at least one component and configured to release one or more signals representing the output characteristics of the at least one component such that the bus functional model engine emulates the operation of the at least one component of the FPGA device under test in the predetermined native target environment.

In a preferred embodiment, the system may further include a component model engine responsive to the input characteristics for generating the output characteristics of the at least one component. The bus functional model circuit may be configured to apply at least one test operation from the at least one component of the FPGA device under test and emulate the results of the at least one test operation in the predetermined native target environment. The system may further include a conversion circuit for converting the output characteristics to electrical or hardware signals and the input characteristics to software signals. The system may further include a controller circuit responsive to the electrical signals for enabling the bus functional model circuit. The system may further include a programming cable coupled between the conversion circuit and the FPGA device under test. The bus functional model engine may simulate and capture output characteristics of a plurality of components of the FPGA device under test and may simulate and release the input characteristics of the plurality of components of the FPGA device under test. The bus functional model circuit may be configured to receive signals destined for the plurality of components of the FPGA device under test corresponding to input characteristics of the plurality of components of the FPGA device under test and configured to apply signals representing output characteristics of the plurality of components of the FPGA device under test such that the bus functional model engine emulates the operation of the plurality of components of the FPGA device under test in the predetermined native target environment. The bus functional model engine may simulate and capture output characteristics of all the components of the FPGA device under test and may simulate and release the input characteristics of all the components of the FPGA device under test. The bus functional model circuit may be configured to receive signals destined for the all the components of the FPGA device under test corresponding to input characteristics of all the components of the FPGA device under test and configured to apply signals representing output characteristics of all the components of the FPGA device under test such that the bus functional model engine emulates the operation of the all the components of the FPGA device under test in the predetermined native target environment. The system may further include a logic simulator coupled to the bus functional model engine for receiving simulated inputs and transmitting simulated outputs.

This invention further features an FPGA emulation system including an FPGA device under test having at least one component and a plurality of pins operating in a predetermined native target environment, a bus functional model engine for simulating and capturing output characteristics of the at least one component of the FPGA device under test and simulating and releasing output characteristics of the at least one component of the FPGA device under test, a bus functional model circuit embedded in the FPGA device under test configured to receive one or more signals corresponding to the input characteristics of the at least one component and configured to release one or more signals representing the output characteristics of the at least one component such that the bus functional model engine emulates the operation of the at least one component of the FPGA device under test in the predetermined native target environment, and a component model engine responsive to the input characteristics for generating the output characteristics of the at least one component.

This invention also features an FPGA emulation system including an FPGA device under test having at least one component and a plurality of pins, a first bus functional model engine for simulating and capturing input characteristics of the FPGA device under test and simulating and releasing output characteristics of the FPGA device under test, a first bus functional model circuit responsive to signals representing the input characteristics configured to apply one or more signals to the FPGA device under test corresponding to the input characteristics of the FPGA device under test and configured to receive one or more signals representing output characteristics of the FPGA device under test such that the bus functional model engine emulates the operation of the FPGA device under test in a predefined selectable and flexible electrical operating environment, a second bus functional model engine for simulating and capturing output characteristics of the at least one component of the FPGA device under test and simulating and releasing input characteristics of the at least one component of the FPGA device under test, and at least one additional bus functional model circuit embedded in the FPGA device under test configured to receive one or more signals corresponding to the input characteristics of the at least one component and configured to release one or more signals representing the output characteristics of the at least one component such that the at least one additional bus functional model engine emulates the operation of the at least one component of the FPGA device under test in the predefined selectable and flexible electrical operating environment In a preferred embodiment, the system may further include a component model engine responsive to the input characteristics of the at least one additional component provided by the at least one second bus functional model circuit for generating the output characteristics of the at least one component.

BRIEF DESCRIPTION OF THE DRAWINGS

Other objects, features and advantages will occur to those skilled in the art from the following description of a preferred embodiment and the accompanying drawings, in which:

FIG. 5 is a schematic block diagram showing an example of the coupling of the bus functional model circuit and the FPGA device under test shown in FIG. 1 and exemplary protective circuitry coupled there between;

FIG. 7 is a schematic block diagram showing the FPGA emulation system shown in FIG. 6 in which a selected component inside the FPGA device under test has been replaced with a bus functional model circuit.

Figure 1:
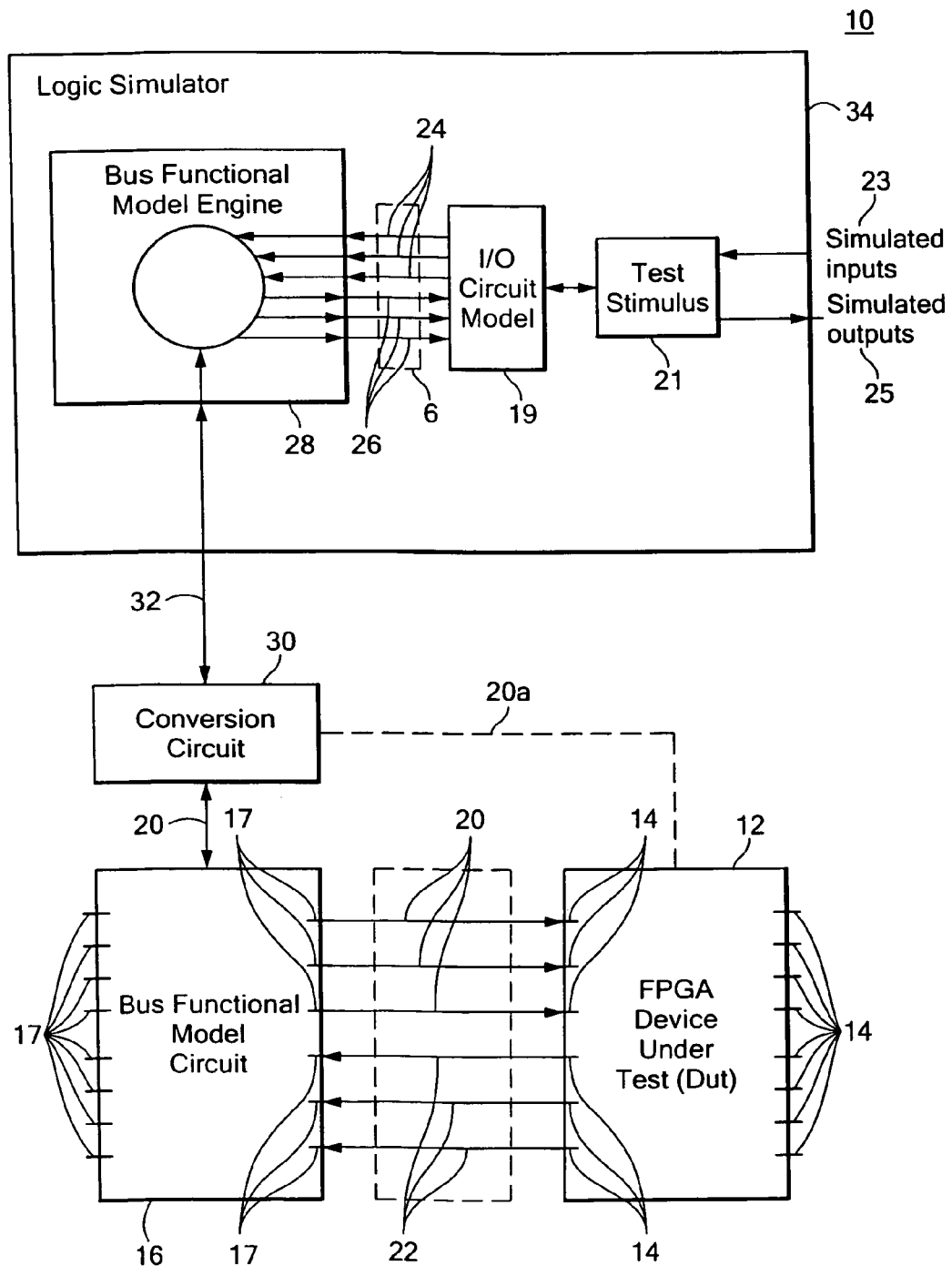
FIG. 1 is a schematic block diagram of one embodiment of the FPGA emulation system of this invention.

Although specific features of this invention are shown in some drawings and not others, this is for convenience only as each feature may be combined with any or all of the other features in accordance with the invention.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, FPGA emulation system 10 of this invention including an FPGA device under test 12 having plurality of pins 14. As discussed in the Background section above, FPGA device under test 12 is an FPGA device that is often used to model and verify a custom logic design before production of a silicon device or a system that incorporates an FPGA. System 10 also preferably includes bus functional model engine 28. Bus functional model engine 28 is program code or software that simulates and captures predetermined input characteristics of FPGA device under test 12 on lines 24. The predetermined input characteristics on lines 24 are preferably provided by logic simulator 34. Typically, simulated inputs 23 are applied to logic simulator 34 to generate test stimulus 21. I/O circuit model 19 is responsive to test stimulus 21 and issues predetermined input characteristics on lines 24 that it expects to land at FPGA device under test 12 that are simulated and captured by bus functional model engine 28.

Conversion circuit 30 receives software signals representing the predetermined input characteristics captured by bus functional model engine 28 on lines 24 and converts them to electrical or hardware signals on line 20. Conversion circuit 30 also generates electrical control signals that enable bus functional model circuit 16.

Bus functional model circuit 16 releases or applies signals to FPGA device under test 12 by lines 20 that correspond to predetermined input characteristics on lines 24. FPGA device under test 12 processes and responds to the signals on lines 20 and sends signals by lines 22 that represent the output characteristics of FPGA device under test 12. The output characteristics signals on lines 22 are received and captured by bus functional model circuit 16. Bus functional model circuit 16 then outputs electrical signals on line 20 that are converted by conversion circuit 30 to software signals on line 32, similar as described above. Bus functional model engine 28 responds to the signals on line 32 that represent the output characteristics of FPGA device under test 12 and releases output characteristics on lines 26 to emulate the operation of FPGA device under test 12 in a predefined selectable and flexible operating environment of FPGA device under test 12 (discussed below). Thus, the predetermined input characteristics on lines 24 captured by bus functional model engine 28 correspond to the input characteristics released by bus functional model circuit 16 on lines 20 and the output characteristics on lines 22 sent by FPGA device under test 12 and captured by bus functional model circuit 16 correspond to the output characteristics released by bus functional model engine 28 on lines 26. I/O circuit model 19 receives the response, or output characteristics, of FPGA device under test 12 simulated and released by bus functional model engine 28 on lines 26. I/O circuit model 19 then generates test stimulus 21 that is output as simulated outputs 25. FPGA emulation system 10 thus uses the bus functional model circuit 16 to manipulate, observe and test the FPGA device under test 12 from outside its device pins.

When the design of FPGA device under test 12 changes, logic simulator 34 is used to receive simulated inputs 23 that are simulated and captured by bus functional model engine 28 as predetermined input characteristics on lines 24. Bus functional model circuit 16 responds to the new input characteristics and applies signals to FPGA device under test 12 that correspond to the input characteristics. The new design of FPGA device under test 12 responds and processes the input characteristics and sends signals to bus functional model circuit 16 that represent the output characteristics of the new design of FPGA device under test 16. Bus functional model circuit 16 captures the new output characteristics of FPGA device under test 12 and bus functional model engine 28 releases the output characteristics to emulate the operation of the new design of FPGA device under test 12.

In a preferred design, bus functional model circuit 16, FIG. 1 can be configured to apply at least one complex test operation, e.g., issuing an ethernet data network packet to FPGA device under test 12 to emulate the results of that test operation in the predefined selectable and flexible operating environment. Ideally, FPGA device under test 12 and bus functional model circuit 16 are chosen to have similar electrical properties and functions.

The generation of the selectable and flexible operating environment of FPGA device under test 12 is now described with reference to FIG. 2, where like parts have been given like numbers. FPGA emulation system 10a includes controller circuit 120 responsive to the electrical control signals converted by conversion circuit 30 on line 20 and commands 92 by line 110. Commands 92 are typically provided by software running on a computer system that also runs logic simulator 34, e.g. computer system 134 (discussed below). Commands 92 are used to program programmable impedance reference devices 122, programmable power supplies 124 programmable oscillators 126, bus functional model circuit 16, and FPGA device under test 12 (also discussed below). Typically, the programming is done prior to running logic simulator 34 and each time the design of FPGA device under test 12 changes. Controller circuit 120 generates control signals on line 121 that enable bus functional model circuit 16. Controller circuit 120 also generates control signals on lines 123, 125, 127 and 129 that select or disable a predetermined number of programmable impedance reference devices 122, programmable timing reference devices 124, programmable power supplies 126 and/or programmable oscillators 128, respectively. The selection and programming of the various programmable impedance reference devices 122, programmable timing reference devices 124, programmable power supplies 126 and programmable oscillators 128 defines the predefined selectable and flexible operating environment of FPGA device under test 12.

The result is that FPGA emulation system 10 of this invention provides an effective and accurate emulation of the operation of FPGA device under test 12, including both digital and analog operations, and operates up to the speed of FPGA device under test 12. Unlike conventional systems that typically rely only on logic simulators that use HDL to model an FPGA being tested, emulation system 10 of this invention emulates the operation of FPGA device under test 12 in a predefined selectable and flexible operating electrical environment. FPGA emulation system 10 easily and accurately emulates the operation FPGA device under test 12 when its design changes and can be configured to select virtually any desired electrical operating environment of FPGA device under test 12. FPGA emulation system 10 eliminates the need to build and/or re-build custom prototype boards or rely on evaluation boards that cannot provide accurate models of a desired FPGA design. If a design change results in a change in the pin-out configuration of FPGA device under test 12, FPGA emulation system 10 can easily emulate and verify the design change. FPGA emulation system 10 is also significantly less expensive, more accurate and easier to use than conventional emulation systems, logic simulators and logic emulators.

Figure 2:
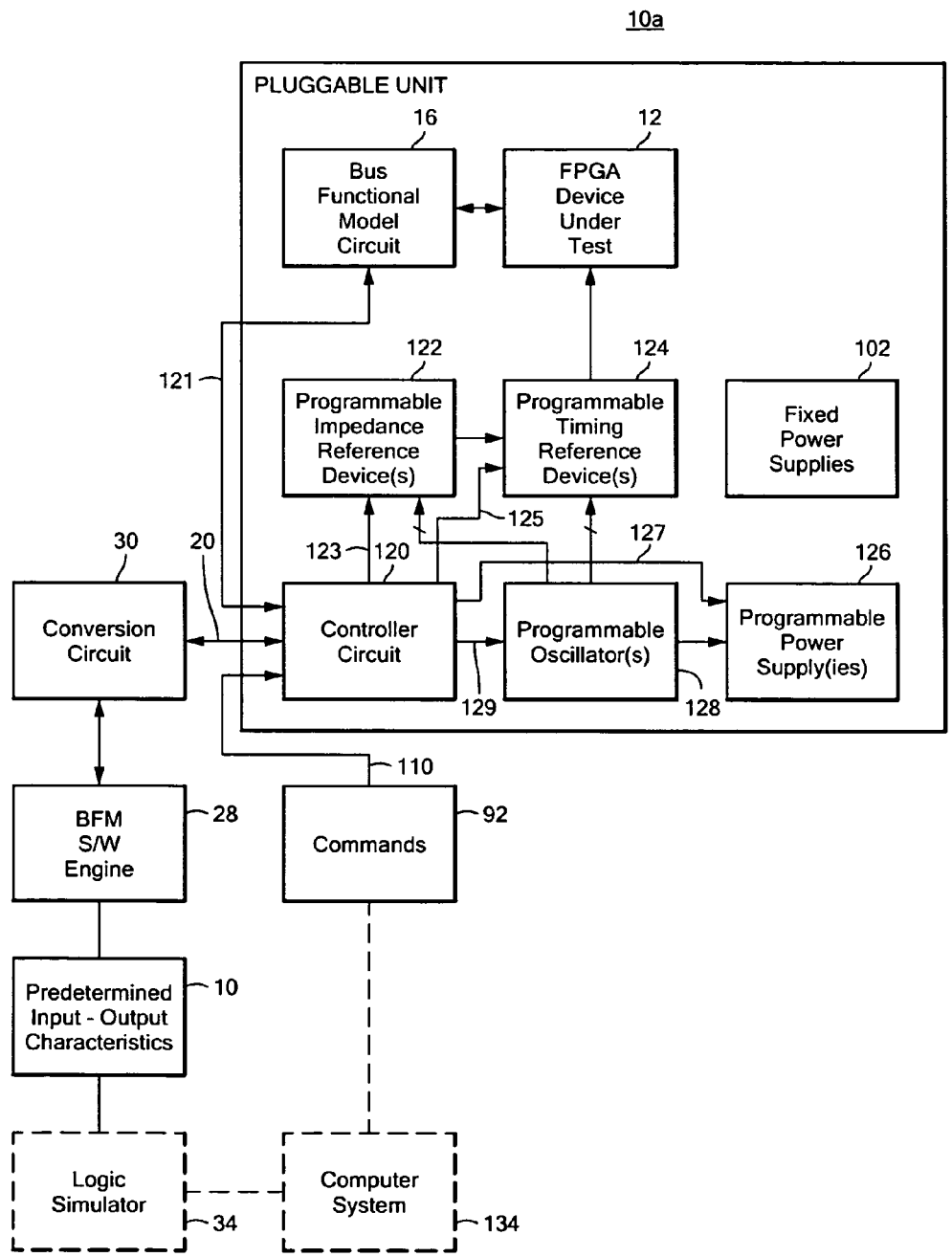
FIG. 2 is a schematic block diagram showing in further detail the components of the FPGA emulation system shown in FIG. 1 that may be disposed on a removable device in accordance with this invention.
Figure 3:
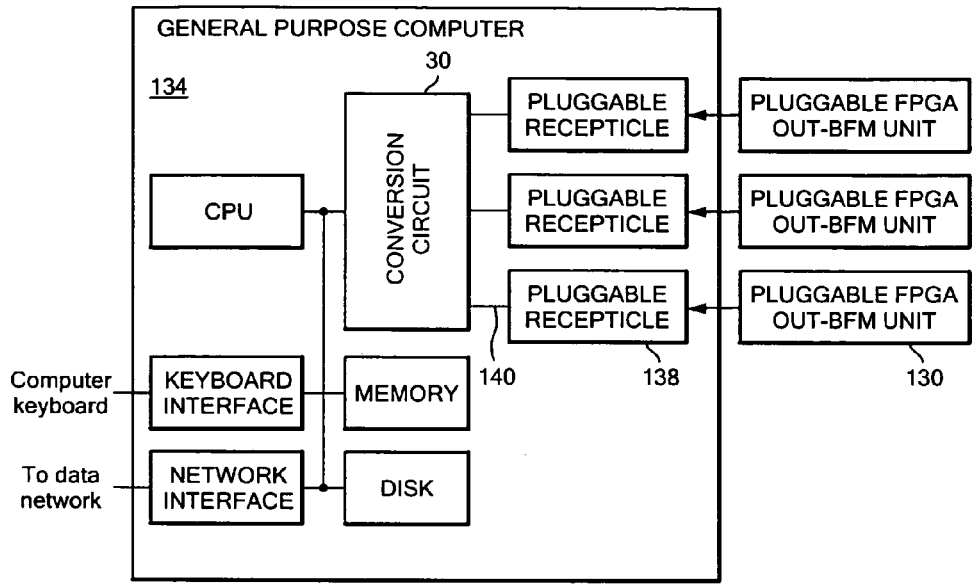
FIG. 3 is a schematic block diagram showing an example of the removable device shown in FIG. 2 integrated with a general purpose computer.

In a preferred design, controller circuit 120, FIG. 2, programmable impedance reference devices 122, programmable power supplies 124 programmable oscillators 126 bus functional model circuit 16, and FPGA device under test 12 are disposed on removable device 130, e.g., a pluggable unit. Removable device or pluggable unit 130 is typically integrated with computer system 134, as shown in FIG. 3, where like parts have been given like numbers. Removable device 130 typically interfaces with pluggable receptacle 138 which interfaces with conversion circuit 30 by line 140.

Figure 4:
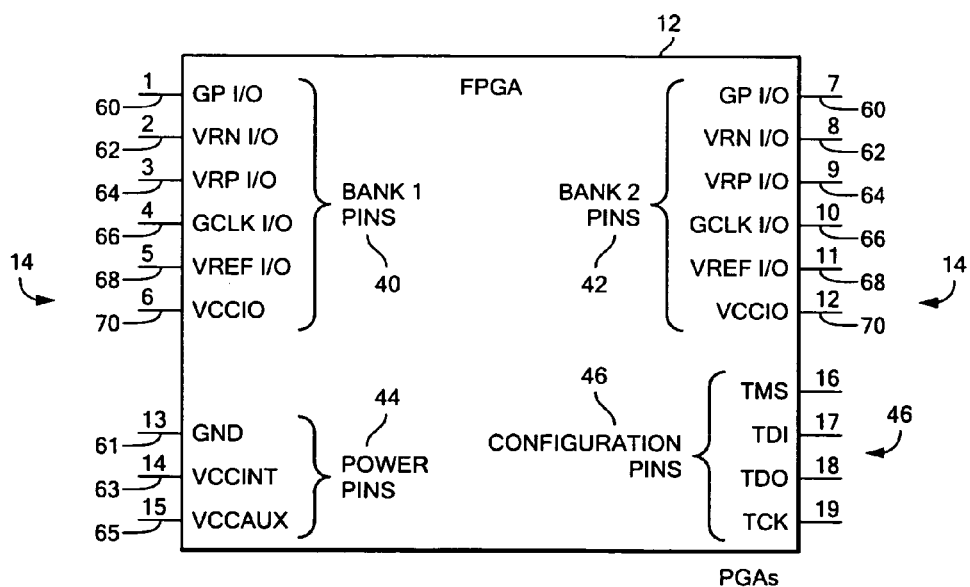
FIG. 4 is a schematic block diagram showing an example of a typical pin layout of the FPGA device being tested and the bus functional model circuit shown in FIG. 1.

An exemplary pinout configuration for plurality of pins 14 of FPGA device under test 12 is shown in FIG. 4. In this example, FPGA device under test 12 includes a plurality of pins 14 that are sub-divided into pin banks 40 and 42, power pins 44 and configuration pins 46. GP I/O pins 60 are general purpose signal pins and may be programmed with a number of different electrical characteristics. VRN I/O pins 62 and VRP I/O pins 64 are connected to circuits inside FPGA device under test 12 that may selectively be used to control the drive characteristics of other signal pins. GCLK I/O pins 66 are pins that can be programmed to behave as dedicated timing reference inputs, e.g., clock inputs and the like. VREF I/O pins 68 are connected to circuits inside the FPGA device under test 12 that may be used as analog voltage references. VCCIO pins 70 are power supply pins for the various I/O drivers of FPGA device under test 12. VCCINT pin 63 and VCCAUX pin 65 are non input-output pins that are typically used to power the FPGA device core logic and configuration pins 46 of the FPGA device under test 12. GND pin 61 is a ground pin. Configuration pins 46 show an example of a typical JTAG interface used for FPGA device programming. Configuration pins 46 are often used to apply signaling sequences to program FPGA device under test 12, as known by those skilled in the art. Bus functional model circuit 16, FIG. 1, similarly includes a plurality of pins 17 that typically have a pin configuration similar to FPGA device under test 12 as shown in FIG. 2.

Figure 5:
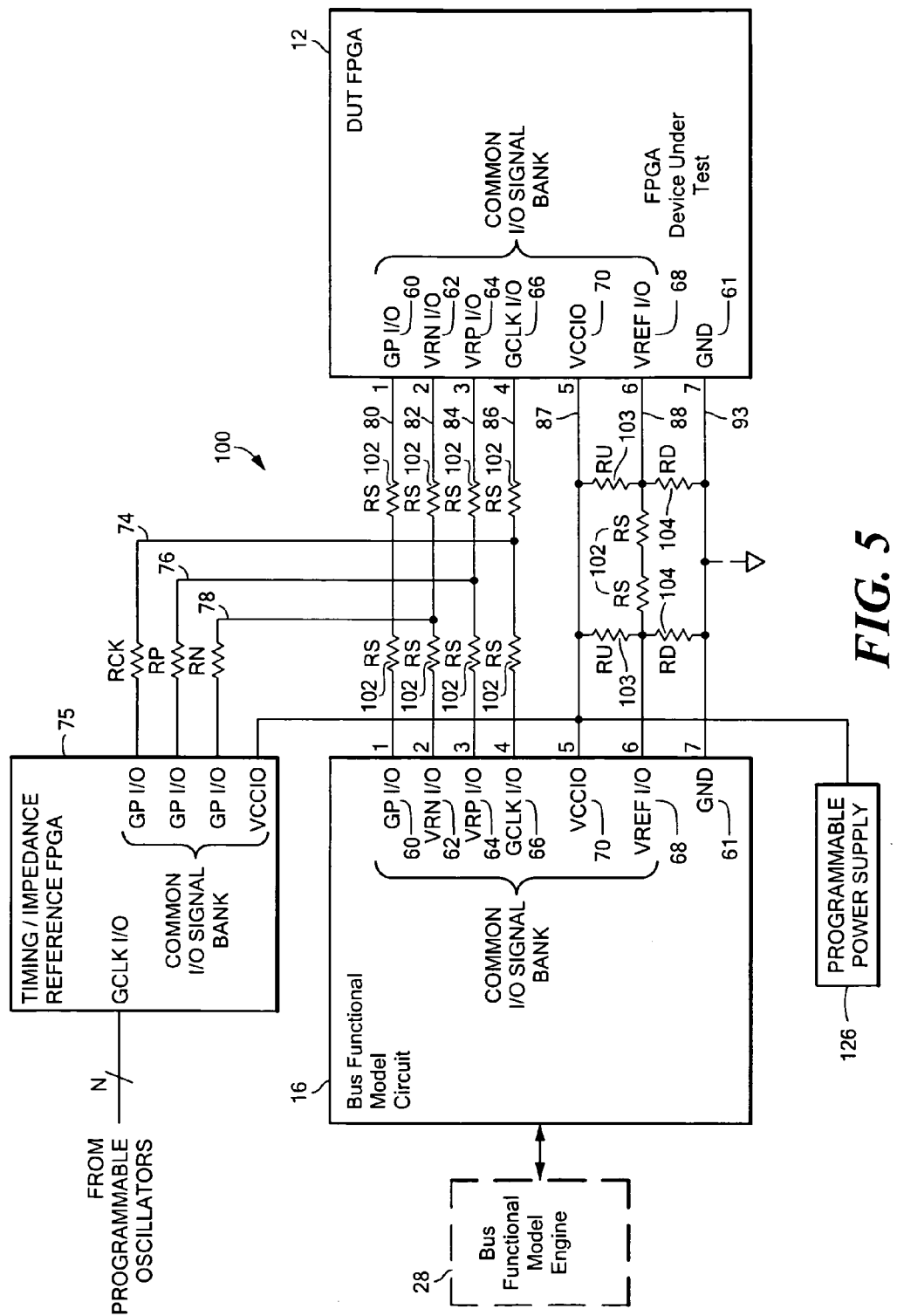

In a preferred design, each pin, or selected pins, of plurality of pins 14, FIG. 1, of FPGA device under test 12 is coupled to the same corresponding pin type of plurality of pins 17 of bus functional model circuit 16. FIG. 5, where like parts have been given like numbers, shows an example in which the exemplary pins between FPGA device under test 12 and bus functional model circuit 16 have been coupled. In one example, each of GP I/O pin 60, VRN I/0 pin 62, VRP I/O pin 64, GCLK I/O pin 66, VCCIO pin 70, VREF I/O pin 68, and ground pin 61 of FPGA device under test 12 is coupled to corresponding pin type 60-72 of bus functional model circuit 16, as by lines 80, 82, 84, 86, 87, 88, and 93, respectively.

Protective circuitry 100, e.g., resistors 102 (RS), resistors 103 (RU), and resistors 104 (RD), is preferably coupled between FPGA device under test 12 and bus functional model circuit 16. Protective circuitry 100 is designed to prevent damage to FPGA device under test 12 and bus functional model circuit 16 if erroneous signals are sent to or from bus functional model circuit 16 and FPGA device under test 12. This protects against accidental mis-programming of FPGA device under test 12 or bus functional model circuit 16. Timing and impedance reference device 75, e.g., another FPGA device, may be coupled to the interconnection between FPGA device under test 12 and bus functional model circuit 16 by lines 74, 76 and 78 to provide a source of free-running clock reference signals and impedance reference signals, as known by those skilled in the art.

Resistors 102 (RS) are current liming series resistors typically coupled on lines 80, 82, 84, 86, and 88 between the FPGA device under test 12 and bus functional model circuit 16. Resistors 102 (RS) reduce the current driven between FPGA device under test 12 and bus functional model circuit 16 if one or both of them is accidentally mis-programmed. For example, if a user programs a signal on bus functional model circuit 16 to drive out to FPGA device under test 12 on any of lines 80, 82, 84, 86, 87, 88 and 93 while the FPGA device under test 12 is driving the same signal back to bus functional model circuit 16, resistors 102 (RS) will dissipate power and prevent damage to the FPGA device under test 12 and bus functional model circuit 16.

In one design, resistors 103 (RU) and resistors 104 (RD) are coupled between lines 87 and 88 and 88 and 93, respectively. Resistors 103 (RU) and resistors 104 (RD) typically generate an analog voltage reference used when the I/O signals in a particular bank of pins 40-46, FIG. 4 require a voltage reference. In this example, resistors 103 (RU), FIG. 5 and resistors 104 (RD) form a voltage divider between power supply pins 68 and 70 and ground pins 61. Each of resistors 102 (RU) and 104 (RD) is preferably a higher resistance than the resistors 102 (RS) in order to not significantly affect the communications of the signals on pins 68 and 70. When the VREF signals on pins 70 are used as analog voltage references, neither bus functional model circuit 16 nor FPGA device under test 12 will drive the signals. The voltage dividers on the resistor pairs 103 (RU) and 104 (RD) are typically set to input voltages approximately one half the VCCIO voltage on pins 68. This provides for the voltage-references that track I/O bank power supplies for signaling families commonly used in modern FPGAs.

Figure 6:
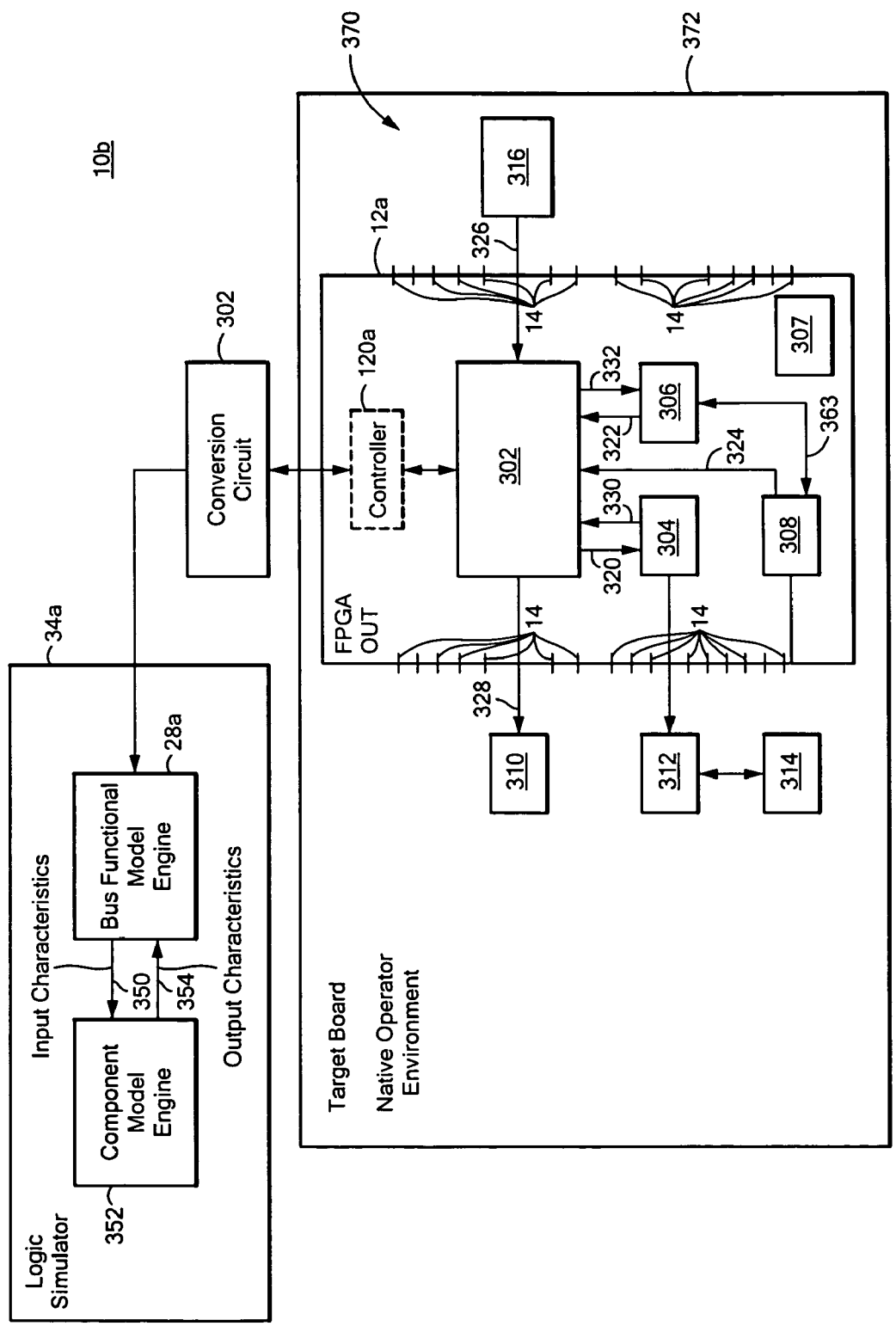
FIG. 6 is a schematic block diagram of another embodiment of the FPGA emulation system of this invention.

FPGA emulation system 10b, FIG. 6, where like parts have been given like numbers, of this invention includes FPGA device under test 12a having plurality of pins 14, similar as described above. FPGA device under test 12a includes and at least one component, e.g., component 302, component 304, component 306, component 307 and/or component 308. Examples of components 302-308 include, inter alia, a custom HDL design, a PLL, an oscillator, a microprocessor, a DSP, a SERDES, or any similar type device that is typically part of an FPGA design included in FPGA device under test 12a that needs to be emulated and verified prior to fabrication.

In this embodiment, FPGA device under test 12a resides in its actual native target environment 370. Native target environment 370 is typically defined by target circuit board 372, e.g., a controller board for a radar system, or any similar type board known to those skilled in the art, that includes various components 310, 312, 314 and 316. Examples of components 310-316 include, inter alia, oscillators, microprocessors, other FPGAs or PLDs, memory devices, such as DRAM and flash, and communications circuits, such as ethernet or RS-232 transceivers.

FPGA emulation system 10b emulates the operation of at least one component, or in other embodiments a plurality of components, or all the components, of components 302-308 inside FPGA device under test 12a while FPGA device under test 12a operates in native target environment 370.

FPGA emulation system 10b, FIG. 7, where like parts have been given like numbers, includes bus functional model circuit 16a embedded in FPGA device under test 12a. Bus functional model circuit 16a replaces a selected component, e.g. component 302 (shown in phantom), of components 302-308 inside FPGA device under test 12a so that FPGA emulation system 10b can emulate the operation of the selected component, a plurality of components, or all the components, of FPGA device under test 12a in native target environment 370. Bus functional model circuit 16a is typically responsive to one or more signals from some, or all, of components 304-308 inside FPGA device under test 12a, e.g., input signals by line 320 from component 304, input signals by line 322 from component 306, and input signals by line 324 from component 308. Bus functional model circuit 16a may also be responsive to input signals from the various components on board 372, such as input signals by line 326 from component 316. The various components inside FPGA device under test 12a may communicate with each other, e.g., by lines 360, 362 and 363, and may also communicate with various components 310-316 outside FPGA device under test 12a on board 370, e.g., by lines 364, 368, 326, and 328.

Bus functional model engine 28a, is software or program code of similar design as bus functional model engine 28 discussed above in reference to FIGS. 1 and 2 with the exception that the direction of input and output characteristics are reversed. Bus functional model engine 28a queries bus functional model circuit 16a by sending software signals by line 32a that are converted by conversion circuit 30a to electrical or hardware signals on line 20a. Controller circuit 120a is responsive to the electrical signals on line 20a and enables bus functional model circuit 16a by line 333. Bus functional model circuit 16a then outputs hardware or electrical signals on line 20a that represents the input signals to bus functional model circuit 16a, e.g., the signals on lines 320, 322, 324 and 326. The electrical signals on line 20a are converted by conversion circuit 30a to software signals on line 32a. Bus functional model engine 28a responds to the signals on line 32a and simulates and releases software signals on line 350 that collectively represent the input characteristics of bus functional model circuit 16a at a particular predetermined point in time, e.g., when bus functional model engine 28a queried bus functional model circuit 16a. Preferably, component model engine 352, e.g., an HDL model of the selected component, or components, e.g., component 302, or any similar type model of the selected component or components as known by those skilled in the art, is responsive to the input characteristics on line 350. Component model engine 352 responds to the input characteristics on line 350 and generates output characteristics on line 354 that model the output of bus functional model circuit 16a in response to the input characteristics on line 350. Bus functional model engine 28a then simulates and captures the output characteristics on line 354. The output characteristics on line 354 are then output to conversion circuit 30a by line 32a. Conversion circuit 30a receives output characteristics captured by bus functional model engine 28a on line 32a and converts the output characteristics represented as software signals to electrical or hardware signals on line 20a. Similar as described above, controller circuit 120a also generates signals that enable bus functional model circuit 16a.

Bus functional model circuit 16a receives the electrical or hardware signals on line 20a that represent the output characteristics of bus functional model circuit 16a generated by component model engine 352 and captured by bus functional model engine 28a. Bus functional model circuit 16a releases or outputs signals, e.g., signals on line 328 to component 310, signals on line 330 to component 304, and signals on line 332 to component 306 that correspond to the output characteristics on line 354 captured by bus functional model engine 28a. The result is bus functional model engine 28a emulates the operation of a selected component of components 302-308 of FPGA device under test 12a, e.g., component 302, in the actual native target environment 370 of FPGA device under test 12a. Thus, an FPGA design can be exercised in its native operating environment 370 prior to completing design of component 302 and/or FPGA device under test 12a. FPGA emulation system 10b virtually acts as a logic simulator inside FPGA device under test 12a and provides an innovative way to emulate the operation of the selected components of components 302-308 of an FPGA device under test 12a in its native target environment.

In one preferred embodiment, FPGA emulation system 10b selects a plurality of components of components 302-308 of FPGA device under test 12a, e.g., components 302 and 304, and emulates the operation of the selected plurality of components 302-304 of FPGA device under test 12a in native target environment 370. In this case, each of components 302-304 are replaced with a bus functional model circuit 16a as described above. Similarly, bus functional model engine 28a will release input characteristics on line 350 that represent all the inputs to components 302-304 and capture output characteristics generated by component model engine 352 that represent all the outputs of components 302-304 to emulate the operation of components 302-304 in native target environment 370. In other examples, FPGA emulation system 10b may select all of components 302-308 of FPGA device under test 12a and emulates the operation of components 302-308 of FPGA device under test in native target environment 370, similar as described above.

In one embodiment, bus functional model circuit 16a may be configured to apply at least one complex test operation, e.g., initializing the contents of a memory array, from the selected component of components 302-308 and emulate the results of the test operation in the predetermined native target environment 370 of FPGA device under test 12a.

In a preferred design, system 10b includes a programming cable 231 (shown in phantom) coupled between conversion circuit 30a and FPGA device under test 12a.

Figure 8A:
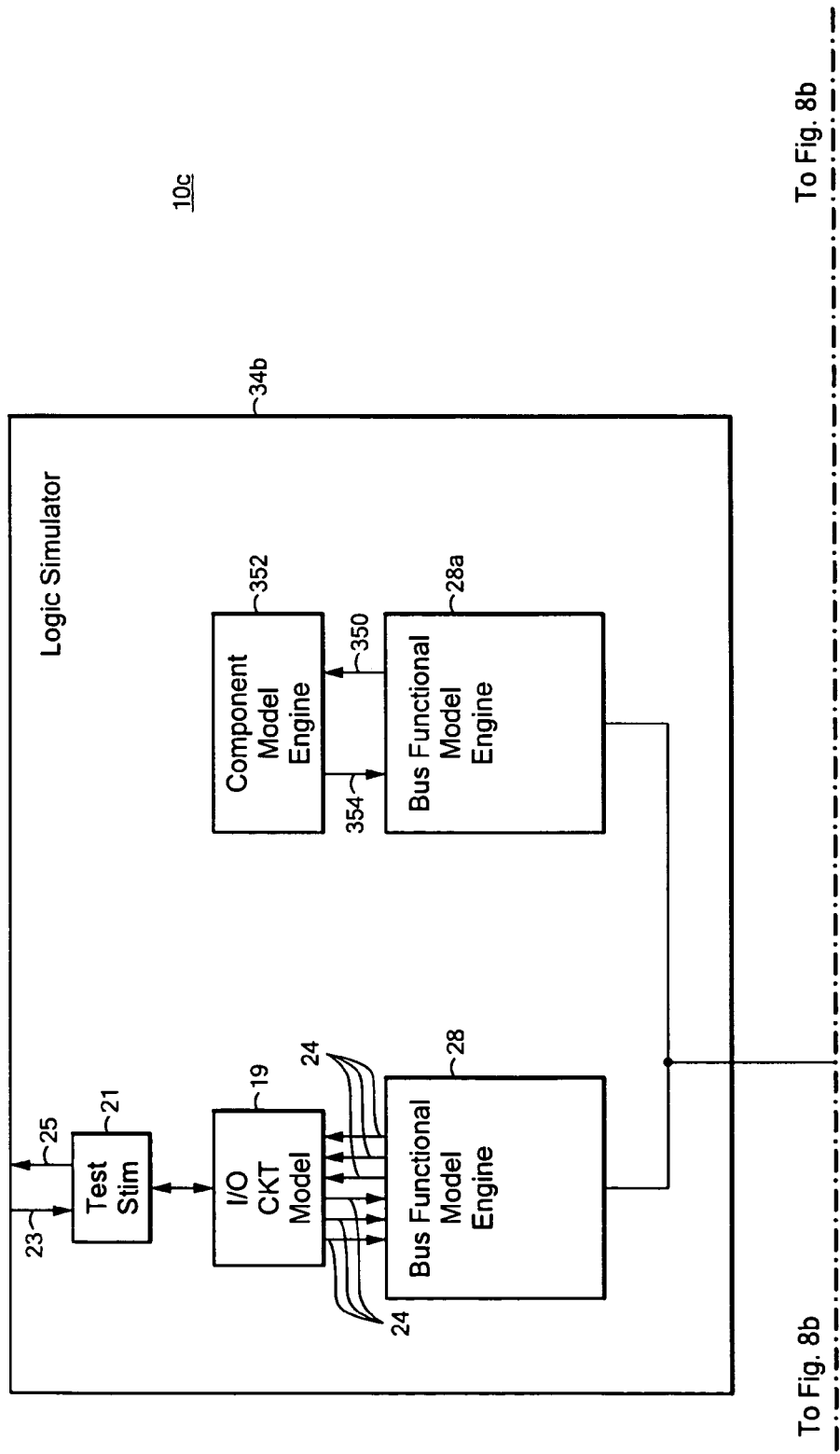
FIG. 8 is a schematic block diagram of another embodiment of the FPGA emulation system of this invention.
Figure 8B:
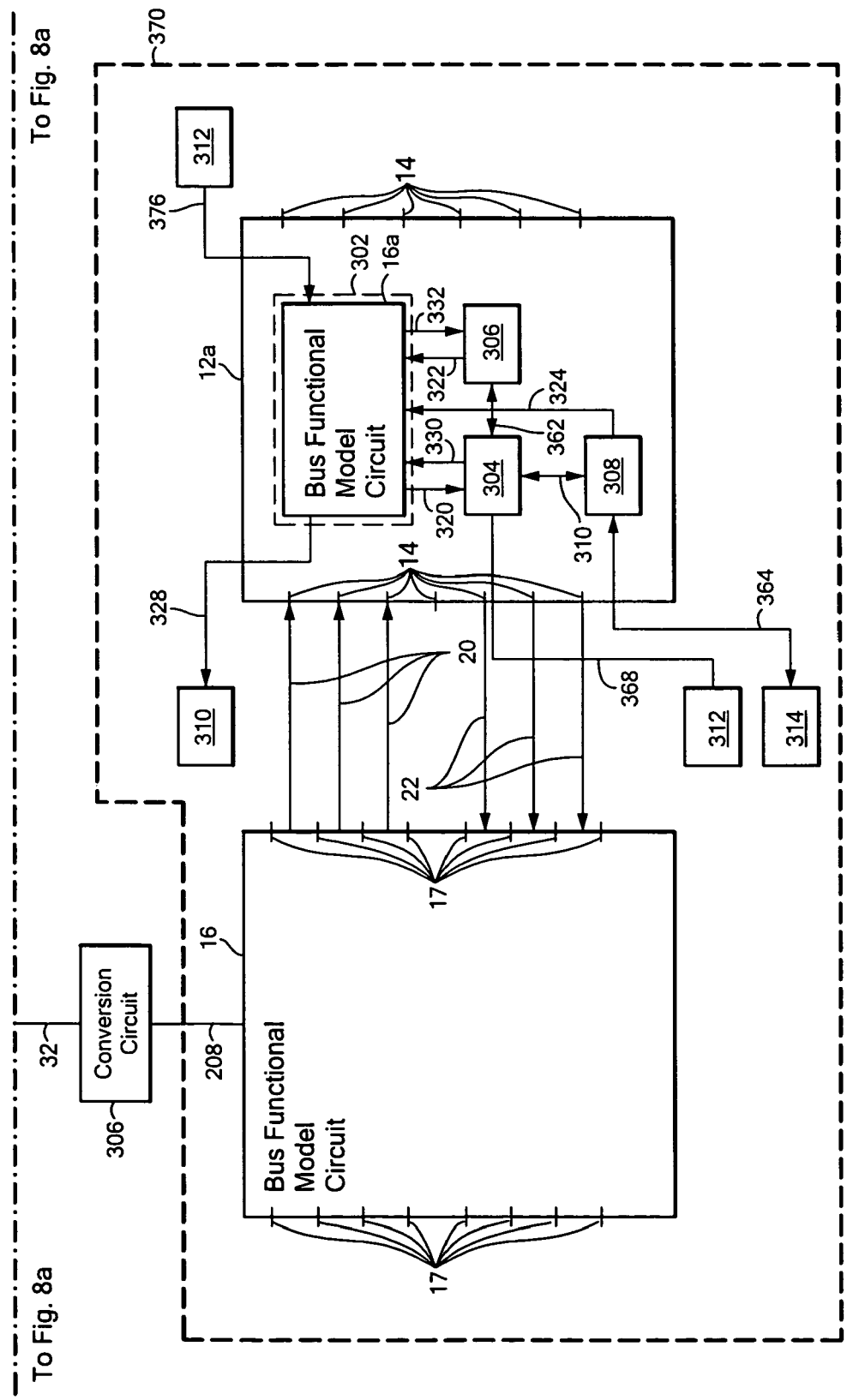

FPGA emulation system 10c, FIG. 8, of this invention, where like parts have been given like numbers, includes FPGA device under test 12a having plurality of pins 14. FPGA device under test 12a includes at least one component, e.g., components 302-308 described above with reference to FIGS. 6 and 7. FPGA emulation system 10c, FIG. 8, includes bus functional model engine 28 that simulates and captures predetermined input characteristics of FPGA device under test 12a on lines 24 and simulates and releases output characteristics on line 26, similar as described above with reference to FIG. 1. Similarly, bus functional model circuit 16 releases or applies signals to FPGA device under test 12a by lines 20 that correspond to predetermined input characteristics on lines 24. FPGA device under test 12a processes and responds to the signals on lines 20 and sends signals by lines 22 that represent the output characteristics of FPGA device under test 12a. Bus functional model 28 then emulates the operation of FPGA device under test 12a in a selectable and flexible operating environment, similar as described above with reference to FIGS. 1 and 2.

However, in this embodiment, FPGA device under test 12a also includes at least one additional bus functional model circuit 16a that replaces a selected component of component 302-308, e.g., component 302 (shown in phantom), similar as described above in reference to FIG. 7. Bus functional model engine 28a, FIG. 8, emulates the operation of the selected component 302 of FPGA device under test 12a in the selectable and flexible operating environment.

In one embodiment, FPGA emulation system 10c may select a plurality or all components 302-308 of FPGA device under test 12a, as discussed above with reference to FIG. 7, to emulate the operation of the selected components of component 302-308 of FPGA device under test 12a the selectable and flexible operating environment.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. An FPGA emulation system comprising:
a physical FPGA device under test having a plurality of pins;
a controller circuit; and
a bus functional model hardware circuit having a plurality of pins coupled to the plurality of pins of the FPGA device under test, the bus function model hardware circuit responsive to signals representing predetermined input characteristics of said FPGA device under test and configured to apply one or more signals to said physical FPGA device under test corresponding to said predetermined input characteristics and configured to receive one or more signals representing output characteristics of said FPGA device under test in order to emulate the operation of said FPGA device under test in a predefined selectable and flexible electrical operating environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

2. The system of claim 1 further including a bus functional model engine for simulating and capturing said predetermined input characteristics and simulating and releasing said output characteristics.

3. The system of claim 2 in which said bus functional model engine emulates the operation of said FPGA device under test in the predefined selectable and flexible electrical operating environment.

4. The system of claim 1 in which said bus functional model hardware circuit is configured to apply at least one test operation to said FPGA device under test and emulate the results of said at least one test operation in said predefined selectable and flexible electrical operating environment.

5. The system of claim 1 in which said bus functional model hardware circuit includes a plurality of pins.

6. The system of claim 5 in which said bus functional model hardware circuit is coupled to said FPGA device under test.

7. The system of claim 6 in which each pin of selected pins of said FPGA device under test is coupled to a corresponding pin type of said bus functional model hardware circuit.

8. The system of claim 6 further including protective circuitry coupled between said FPGA device under test and said bus functional model hardware circuit.

9. The system of claim 1 in which said bus functional model hardware circuit and said FPGA device under test are chosen to have similar corresponding electrical properties and functions.

10. The system of claim 1 in which said one or more signals applied to said FPGA device under test include one or more signals chosen from the group consisting of: power supply signals, timing reference signals, impedance reference signals, and signals representing said predetermined input characteristics.

11. The system of claim 1 in which said controller circuit is responsive to said predetermined input characteristics and commands that select one or more of at least one programmable power supply, at least one programmable oscillator circuit, at least one programmable impedance reference device, and at least one programmable timing reference device to define said predefined selectable and flexible electrical operating environment.

12. The system of claim 11 in which said at least one programmable impedance reference device provides one or more impedance reference signals to said bus functional model hardware circuit and said FPGA device under test.

13. The system of claim 11 in which said at least one programmable timing reference device provides one or more timing reference signals to said bus functional model hardware circuit and said FPGA device under test.

14. The system of claim 11 in which said bus functional model hardware circuit, said FPGA device under test, said controller circuit, said at least one programmable power supply, said at least one programmable oscillator circuit, said at least one programmable impedance reference device, and said at least one programmable timing reference device are disposed on a removable device.

15. The system of claim 14 in which said removable device is integrated with a computer system.

16. The system of claim 15 further including a conversion circuit for converting said predetermined input characteristics to electrical control signals and said output characteristics to software signals.

17. The system of claim 16 in which said electrical control signals enable said bus functional model hardware circuit.

18. The system of claim 16 in which said electrical control signals enable one or more of said at least one programmable power supply, said at least one programmable oscillator circuit, said at least one programmable impedance reference device, and a said at least one programmable timing reference device.

19. The system of claim 2 further including a logic simulator coupled to said bus functional model engine for receiving simulated inputs and transmitting simulated outputs.

20. An FPGA emulation system comprising:
a controller circuit; and
a bus functional model hardware circuit having a plurality of pins coupled to a plurality of pins of a physical FPGA device under test, the bus function model hardware circuit responsive to signals representing predetermined input characteristics of a physical FPGA device under test having a plurality of pins and configured to apply one or more signals to said FPGA device under test corresponding to said predetermined input characteristics and configured to receive one or more signals representing output characteristics of said FPGA device under test to emulate the operation of said FPGA device under test in a predefined selectable and flexible electrical operating environment associated with the FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

21. An FPGA emulation system comprising:
a physical FPGA device under test having a plurality of pins;
a bus functional model engine for simulating and capturing predetermined input characteristics of said FPGA device under test and simulating and releasing output characteristics of said FPGA device under test;
a controller circuit; and
a bus functional model hardware circuit having a plurality of pins coupled to the plurality of pins of the FPGA device under test, the bus function model hardware circuit responsive to signals representing said predetermined input characteristics configured to apply one or more signals to said FPGA device under test corresponding to said predetermined input characteristics and configured to receive one or more signals representing output characteristics of said FPGA device under test such that said bus functional model engine emulates the operation of said FPGA device under test in a predefined selectable and flexible electrical operating environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

22. The system of claim 21 in which said bus functional model hardware circuit is configured to apply at least one test operation to said FPGA device under test and emulate the results of said at least one test operation in said predefined selectable and flexible electrical operating environment.

23. The system of claim 21 in which said bus functional model hardware circuit includes a plurality of pins.

24. The system of claim 23 in which said bus functional model hardware circuit is coupled to said FPGA device under test.

25. The system of claim 24 in which each pin, or selected pins, of said FPGA device under test is coupled to a corresponding pin type of said bus functional model hardware circuit.

26. The system of claim 24 further including protective circuitry coupled between said FPGA device under test and said bus functional model hardware circuit.

27. The system of claim 21 in which said bus functional model hardware circuit and said FPGA device under test are chosen to have similar corresponding electrical properties and functions.

28. The system of claim 21 in which said one or more signals applied to said FPGA device under test include one or more signals chosen from the group consisting of: power supply signals, timing reference signals, impedance reference signals, and signals representing said predetermined input characteristics.

29. The system of claim 21 in which said controller circuit is responsive to said predetermined input characteristics and commands that select one or more of at least one programmable power supply, at least one programmable oscillator circuit, at least one programmable impedance reference device, and at least one programmable timing reference device to define said predefined selectable and flexible electrical operating environment.

30. The system of claim 29 in which said at least one programmable impedance reference device provides one or more impedance reference signals to said bus functional model hardware circuit and said FPGA device under test.

31. The system of claim 29 in which said at least one programmable timing reference device provides one or more timing reference signals to said bus functional model hardware circuit and said FPGA device under test.

32. The system of claim 29 in which said at least one programmable power supply, said at least one programmable oscillator circuit, said at least one programmable impedance reference device, and a said at least one programmable timing reference device are disposed on a removable device.

33. The system of claim 32 in which said removable device is integrated with a computer system.

34. The system of claim 33 further including a conversion circuit for converting said predetermined input characteristics to electrical control signals and said output characteristics to software signals.

35. The system of claim 34 in which said electrical control signals enable said bus functional model hardware circuit.

36. The system of claim 35 in which said electrical control signals enable one or more of said at least one programmable power supply, said at least one programmable oscillator circuit, said at least one programmable impedance reference device, and said at least one programmable timing reference device.

37. The system of claim 21 further including a logic simulator coupled to said bus functional model engine for receiving simulated inputs and transmitting simulated outputs.

38. An FPGA emulation system comprising:
a bus functional model engine for simulating and capturing predetermined input characteristics of a physical FPGA device under test having a plurality of pins and simulating and releasing output characteristics of said FPGA device under test;
a controller circuit; and
a bus functional model hardware circuit having a plurality of pins coupled to a plurality of pins of the FPGA device under test, the bus function model hardware circuit responsive to signals representing said predetermined input characteristics configured to apply one or more signals to said FPGA device under test corresponding to said predetermined input characteristics of said FPGA device under test such that said bus functional model engine emulates the operation of said FPGA device under test in a predefined selectable and flexible electrical operating environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

39. An FPGA emulation system comprising:
a physical FPGA device under test having a plurality of pins;
a bus functional model hardware circuit having a plurality pins coupled to the pins of the FPGA device;
a connector coupling the pins of the FPGA device under test to the pins of the bus functional model hardware circuit;
a controller circuit; and
wherein the bus functional model hardware circuit is programmed to input signals into said FPGA device under test and to receive output signals from said FPGA device under test to emulate the operation of said FPGA device under test in a predefined selectable and flexible electrical operating environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

40. The system of claim 39 in which said bus functional model hardware circuit is configured to apply at least one test to said FPGA device under test in said predefined selectable and flexible electrical operating environment and emulate the results of said at least one test.

41. The system of claim 39 in which each pin, or selected pins, of said FPGA device under test is coupled to a corresponding pin type of said bus functional model hardware circuit.

42. The system of claim 39 further including protective circuitry coupled between the pins of said FPGA device under test and said bus functional model hardware circuit.

43. An FPGA emulation system comprising:
a physical FPGA device under test having at least one component and a plurality of pins operating in a predetermined native target environment;
a bus functional model engine for simulating and capturing output characteristics of said at least one component of said FPGA device under test and simulating and releasing input characteristics of said at least one component of said FPGA device under test;
a controller circuit; and
a bus functional model hardware circuit embedded in said FPGA device under test configured to receive one or more signals representing said input characteristics of said at least one component and configured to release one or more signals representing said output characteristics of said at least one component such that said bus functional model engine emulates the operation of said at least one component of said FPGA device under test in said predetermined native target environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board.

44. The system of claim 43 further including a component model engine responsive to said input characteristics for generating said output characteristics of said at least one component.

45. The system of claim 43 in which said bus functional model hardware circuit is configured to apply at least one test operation from said at least one component of said FPGA device under test and emulate the results of said at least one test operation in said predetermined native target environment.

46. The system of claim 43 further including a conversion circuit for converting said output characteristics to electrical or hardware signals and said input characteristics to software signals.

47. The system of claim 46 in which said controller circuit is responsive to said electrical signals for enabling said bus functional model hardware circuit.

48. The system of claim 46 further including a programming cable coupled between said conversion circuit and said FPGA device under test.

49. The system of claim 43 in which said bus functional model engine simulates and captures output characteristics of a plurality of components of said FPGA device under test and simulates and releases the input characteristics of said plurality of components of said FPGA device under test.

50. The system of claim 49 in which said bus functional model hardware circuit is configured to receive signals destined for said plurality of components of said FPGA device under test corresponding to input characteristics of said plurality of components of said FPGA device under test and configured to apply signals representing output characteristics of said plurality of components of said FPGA device under test such that said bus functional model engine emulates the operation of said plurality of components of said FPGA device under test in said predetermined native target environment.

51. The system of claim 50 in which said bus functional model engine simulates and captures output characteristics of said plurality of components of said FPGA device under test and simulates and releases the input characteristics of said plurality of components of said FPGA device under test.

52. The system of claim 51 in which said bus functional model hardware circuit is configured to receive signals destined for said plurality of components of said FPGA device under test corresponding to input characteristics of all the components of said FPGA device under test and configured to apply signals representing output characteristics of said plurality of components of said FPGA device under test such that said bus functional model engine emulates the operation of said plurality of components of said FPGA device under test in said predetermined native target environment.

53. The system of claim 43 further including a logic simulator coupled to said bus functional model engine for receiving simulated inputs and transmitting simulated outputs.

54. An FPGA emulation system comprising:
a physical FPGA device under test having at least one component and a plurality of pins operating in a predetermined native target environment;
a bus functional model engine for simulating and capturing input characteristics of said at least one component of said FPGA device under test and simulating and releasing output characteristics of said at least one component of said FPGA device under test;
a controller circuit;
a bus functional model hardware circuit embedded in said FPGA device under test configured to receive one or more signals corresponding to said input characteristics of said at least one component and configured to release one or more signals representing said output characteristics of said at least one component such that said bus functional model engine emulates the operation of said at least one component of said FPGA device under test in said predetermined native target environment associated with the physical FPGA device under test such that when a design change in the FPGA device under test results in a change in the pin-out configuration of the FPGA device under test, the controller circuit is configured to program the selectable and flexible electrical operating environment, the FPGA device under test, and the bus functional model hardware circuit so that the FPGA emulation system can emulate and verify the design change without the need to rebuild a prototype board; and
a component model engine responsive to said input characteristics for generating said output characteristics of said at least one component.

55. An FPGA emulation system comprising:
a physical FPGA device under test having at least one component and a plurality of pins;
a first bus functional model engine for simulating and capturing input characteristics of said FPGA device under test and simulating and releasing output characteristics of said FPGA device under test;
a controller circuit;
a first bus functional model hardware circuit having a plurality of pins coupled to the plurality of pins of the FPGA device under test, the bus function model hardware circuit responsive to signals representing said input characteristics configured to apply one or more signals to said FPGA device under test corresponding to said input characteristics of said FPGA device under test and configured to receive one or more signals representing output characteristics of said FPGA device under test such that said first bus functional model engine emulates the operation of said FPGA device under test in a predefined selectable and flexible electrical operating environment associated with the physical FPGA device under test such that when a design change in the FPGA device under test results in a change in the pin-out configuration of the FPGA device under test, the controller circuit is configured to program the selectable and flexible electrical operating environment, the FPGA device under test and the first bus functional model hardware circuit so that the FPGA emulation system can emulate and verify the design change without the need to rebuild a prototype board;
a second bus functional model engine for simulating and capturing output characteristics of said at least one component of said FPGA device under test and simulating and releasing input characteristics of said at least one component of said FPGA device under test; and
at least one additional bus functional model hardware circuit embedded in said FPGA device under test configured to receive one or more signals corresponding to said input characteristics of said at least one component and configured to release one or more signals representing said output characteristics of said at least one component such that said at least one additional bus functional model hardware circuit emulates the operation of said at least one component of said FPGA device under test in said predefined selectable and flexible electrical operating environment such that when a design change in the FPGA device under test results in a change in the pin-out configuration of the FPGA device under test, the controller circuit is configured to program the selectable and flexible electrical operating environment, the FPGA device under test, and the at least one additional bus functional model hardware circuit so that the FPGA emulation system can emulate and verify the design change without the need to rebuild a prototype board.

56. The system of claim 55 further including a component model hardware engine responsive to said input characteristics of said at least one component provided by said at least one additional bus functional model hardware circuit for generating said output characteristics of said at least one component.

* * * * *